US009180489B2

(12) United States Patent
Zaitsu et al.

(10) Patent No.: US 9,180,489 B2
(45) Date of Patent: Nov. 10, 2015

(54) ELECTROMECHANICAL TRANSDUCER

(71) Applicant: CANON KABUSHIKI KAISHA, Tokyo (JP)

(72) Inventors: Yoshitaka Zaitsu, Ichikawa (JP); Takehiko Kawasaki, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/445,945

(22) Filed: Jul. 29, 2014

(65) Prior Publication Data

US 2014/0331491 A1 Nov. 13, 2014

Related U.S. Application Data

(63) Continuation of application No. 13/610,144, filed on Sep. 11, 2012, now abandoned, which is a continuation of application No. 12/753,782, filed on Apr. 2, 2010, now Pat. No. 8,299,550.

(30) Foreign Application Priority Data

Apr. 10, 2009 (JP) ................................ 2009-096145

(51) Int. Cl.
*H01L 21/32* (2006.01)
*B06B 1/02* (2006.01)

(52) U.S. Cl.
CPC ......... *B06B 1/0292* (2013.01); *Y10T 29/49117* (2015.01); *Y10T 29/49155* (2015.01)

(58) Field of Classification Search
CPC ............ B06B 1/0292; Y10T 29/49117; Y10T 29/49155
USPC .............................. 257/416, E21.002, 29.324
See application file for complete search history.

(56) References Cited

U.S. PATENT DOCUMENTS 8,299,550 B2 * 10/2012 Zaitsu et al. .................. 257/416

* cited by examiner

*Primary Examiner* — Michael Lebentritt
(74) *Attorney, Agent, or Firm* — Canon U.S.A., Inc. IP Division

(57) ABSTRACT

When the initial displacement greatly varies among cells in an element, there is a need to reduce a bias voltage to be applied between electrodes. This decreases the sensitivity. An electromechanical transducer of the present invention includes an element having a plurality of cells. Each of the cells includes a first electrode and a second electrode that are provided with a cavity being disposed therebetween. A groove is provided at a position at a predetermined distance from the cavity of the cell on the outermost periphery of the element.

14 Claims, 10 Drawing Sheets

FIG. 6B1
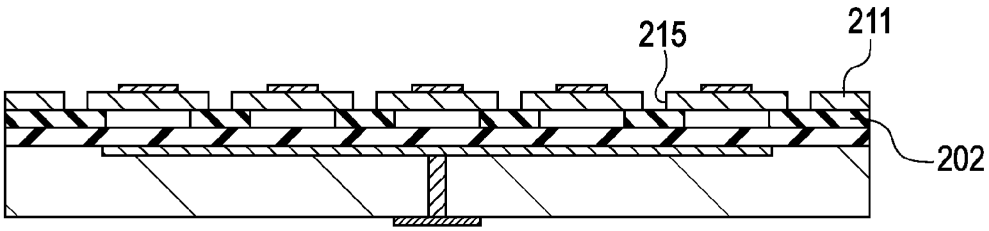
FIG. 6B2
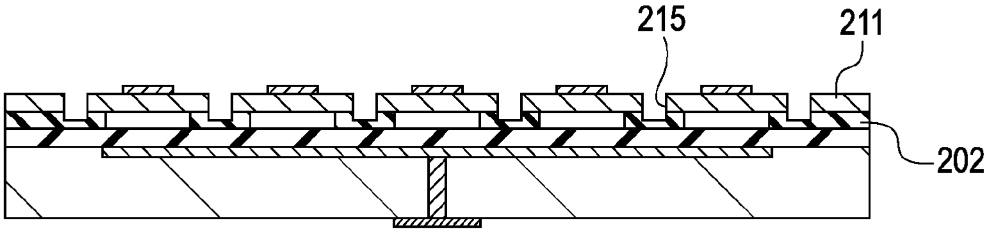

ELECTROMECHANICAL TRANSDUCER

CROSS REFERENCE TO RELATED APPLICATIONS

The present application is a continuation of U.S. patent application Ser. No. 13/610,144, filed on Sep. 11, 2012, which is a continuation of U.S. patent application Ser. No. 12/753,782, filed on Apr. 2, 2010, the content of which are expressly incorporated by reference herein in their entirety. This application also claims the benefit of Japanese Application No. 2009-096145 filed Apr. 10, 2009, which is hereby incorporated by reference herein in its entirety.

BACKGROUND OF THE INVENTION

1. Field of the Invention

The present invention relates to an electromechanical transducer.

2. Description of the Related Art

In recent years, electromechanical transducers produced by a micromachining process have been researched actively. In particular, capacitive electromechanical transducers called capacitive micromachined ultrasonic transducers (CMUT) have attracted attention, because they can transmit and receive ultrasonic waves with a lightweight membrane and can obtain wider band characteristics than piezoelectric electromechanical transducers of the related art.

A CMUT includes a plurality of elements arranged in an array in a one-dimensional or two-dimensional direction. Elements serve to transmit and receive ultrasonic waves. FIG. 11A is a schematic top view of a CMUT of the related art. An element 301 shown in FIG. 11A includes a plurality of cells 311. By simultaneously applying a driving voltage signal to the cells 311 of the element 301, ultrasonic waves are output from the element 301. Further, ultrasonic detection signals received by the cells 311 of the element 301 are added by upper electrodes 315 and a lower electrode (not shown) that is common to the cells 311, and the sum serves as an ultrasonic detection signal received by the element 301. The upper electrodes 315 in the cells 311 are electrically connected by lines 307.

U.S. Pat. No. 6,958,255 discloses an example of a CMUT having such an element structure. In this CMUT, a substrate penetrating line 304 is provided in a support substrate 303, as shown in FIG. 11B. A circuit board 305 is electrically connected to a lower electrode 316 by the substrate penetrating line 304, and is electrically connected to upper electrodes 315 by lines, an insulating-layer penetrating line, and the substrate penetrating line 304. In the circuit board 305, driving voltage signals are generated to output an ultrasonic wave from an element, and an ultrasonic signal generated by an ultrasonic wave received by the element is subjected to processing such as amplification and delay addition.

Unfortunately, the displacement amount of the membrane varies among the cells of the element. It can be conceived that this variation among the cells is caused by warping of the substrate due to the difference in coefficient of thermal expansion between the membrane and the insulating layer and internal stresses of the membrane and the insulating layer. The variation is undesirable because it appears as differences in transmission efficiency and detection sensitivity for the ultrasonic wave.

The transmission efficiency and detection sensitivity of the CMUT increase as the gap between the upper and lower electrodes decreases. Since electrostatic attractive force between the upper and lower electrodes is increased by increasing the bias voltage, the transmission efficiency and detection sensitivity of the CMUT can be enhanced by increasing the bias voltage. However, when the bias voltage excessively increases, the upper electrode is attracted to the lower electrode together with the membrane the instant that the bias voltage reaches a certain voltage, so that it is difficult to obtain a desired vibration characteristic. This phenomenon is referred to as a pull-in, and a voltage at which a pull-in occurs is referred to as a pull-in voltage. A pull-in voltage is determined by the initial displacement amount of the membrane. Thus, since the upper limit value of the bias voltage applied between the upper and lower electrodes is limited by variation in initial displacement amount of the membrane among the cells, the receiving sensitivity of the CMUT is limited.

SUMMARY OF THE INVENTION

The present invention provides an electromechanical transducer that reduces variation in displacement amount of a membrane among cells.

An electromechanical transducer according to an aspect of the present invention includes an element. The element includes a plurality of cells each including a first electrode and a second electrode provided with a cavity being disposed therebetween. A groove is provided at a predetermined distance from the cavity of the cell on the outermost periphery of the element.

The presence of the groove on the outer side of the cell on the outermost periphery of the element can provide an electromechanical transducer that reduces variation in displacement amount of a membrane among cells.

Further features of the present invention will become apparent from the following description of exemplary embodiments with reference to the attached drawings.

BRIEF DESCRIPTION OF THE DRAWINGS

FIGS. 6B1 and 6B2 are schematic views illustrating another method for producing a CMUT to which the present invention can be applied.

DESCRIPTION OF THE EMBODIMENTS

Figure 1A:
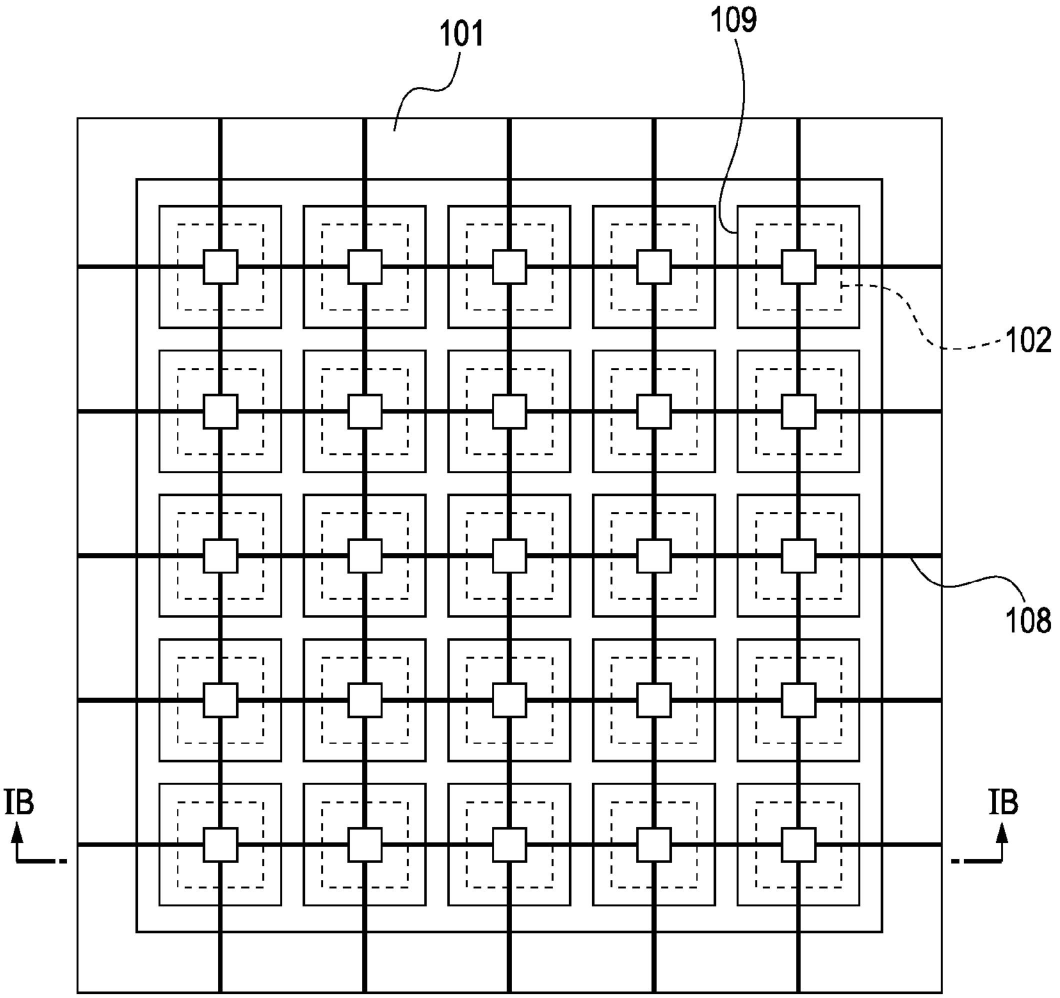
FIGS. 1A and 1B are schematic views illustrating a structure of an element in a CMUT according to a first embodiment of the present invention.

An electromechanical transducer according to the present invention includes an element having a plurality of cells. A groove is provided at a position at a predetermined distance from a cavity of a cell on the outermost periphery of the element. In each of the cells, a lower electrode serving as a first electrode and an upper electrode serving as a second electrode are provided with a cavity being disposed therebetween. Further, a thin film (hereinafter referred to as a membrane) serving as a vibrating film to be deformed by the potential difference between the upper and lower electrodes is provided on the cavity.

In the present invention, the term "a position at a predetermined distance" refers to a position that satisfies the following two conditions. The first condition is that the position is provided on an outer side of a cell on the outermost periphery of the element. The second condition is that, when a groove is formed at the position, a difference in initial displacement amount of the membrane between the outermost cell and a center cell in the element is smaller than when the groove is not formed. Although details will be described below, the distance from the cavity of the cell on the outermost periphery is preferably within a range of 50 to 200% of the inter-cavity distance. Further, the term "groove" refers to a structure that meets any of the following four definitions (1) to (4): (1) a recess formed in the membrane from an upper surface of the membrane (a surface opposite the cavity); (2) a recess formed in the membrane and an insulating layer serving as a support portion supporting the membrane; (3) a recess defined by the absence of the membrane around the cell on the outermost periphery of the element; and (4) a recess defined in an upper surface of the support portion (a surface opposite the bottom of the cavity) by the absence of the membrane on the outer periphery of the element. That is, in the electromechanical transducer of the present invention, a portion of the membrane provided at the position at a predetermined distance from the cavity of the cell on the outermost periphery of the element is thinner than a portion of the membrane provided on the cavity, or is removed.

In the present invention, the term "membrane" refers not only to a vibrating portion provided on the cavity, but also to a portion provided between the cavities and a portion provided on the outer side of the cell on the outermost periphery, because they are formed as one thin film.

In the present invention, the upper electrode can be formed by a film made of a choice from metal, a low-resistance amorphous silicon, and a low-resistance oxide semiconductor. The membrane may also function as the upper electrode. Further, when the upper electrode is provided at the membrane, it may be located on any of the upper and lower sides of the membrane, or may be provided between membranes.

The lower electrode can be formed of any material that has a low electrical resistance, for example, a doped single-crystal silicon substrate, a doped polycrystal silicon film, a single-crystal silicon substrate having a doped region serving as a lower electrode, a doped amorphous silicon, an oxide semiconductor, or a metal film. The substrate can also function as the lower electrode.

It is conceivable that variation in displacement amount of the membrane among the cells is reduced by the configuration of the electromechanical transducer of the present invention for the following reason: In a peripheral edge portion of the cell on the outermost periphery of the element, the structures of the membrane and the insulating layer (e.g., the joint area between the membrane and the insulating layer) are identical or close to those of the other cells. Thus, the distribution of internal stress of the membrane in the cell on the outermost periphery is identical or close to that of the other cells. Hence, it is conceivable that the effect of reducing variation in displacement amount of the membrane among the cells can be obtained by forming a groove in a portion of the membrane on the outer periphery of the element.

In the following first to fourth embodiments, a groove is provided around each cell (grooves are provided between cavities). However, in the present invention, the difference in initial displacement amount can be reduced as long as a groove is provided on an element basis (the groove is provided at a position at a predetermined distance from the cavities of the cells on the outermost periphery of the element), instead of being provided on a cell basis.

First Embodiment

Figure 1B:
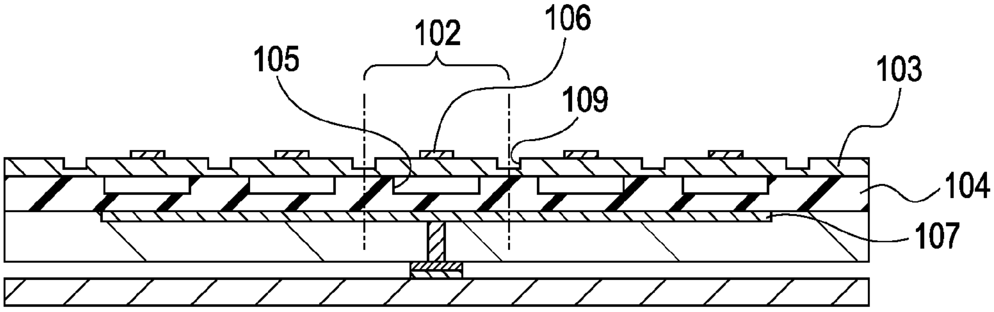

A first embodiment of the present invention will be described below. FIG. 1A is a top view of an element 101 of the first embodiment, and FIG. 1B is a cross-sectional view taken along broken line IB-IB of FIG. 1A. Referring to FIGS. 1A and 1B, the element 101 includes cells 102 arranged in a plane. Each cell 102 includes a membrane 103, an insulating layer 104, a cavity 105 formed by a recess provided in the insulating layer 104, an upper electrode 106, and a lower electrode 107. The upper electrode 106 and the lower electrode 107 in each cell 102 are connected electrically. All upper electrodes 106 are electrically connected by lines 108, and the lower electrodes 107 are electrically isolated from one another. Further, grooves 109 are provided in an upper surface of the membrane 103 and on the outer peripheries of the cells 102 (in other words, grooves 109 are provided between the cavities 105). In the first embodiment, the grooves 109 are connected to surround the cavities 105 at peripheral edge portions of the cells 102, and the depth of the grooves 109 is smaller than the thickness of the membrane 103. Since the joint area between the membrane 103 and the insulating layer 104 does not change, variation in displacement amount of the membrane among the cells can be reduced without decreasing the joint strength between the membrane 103 and the insulating layer 104 supporting the membrane 103.

To verify the advantages of the present invention, the initial displacement amount of the membrane was calculated using a finite element method. The initial displacement amount of the membrane is the amount of displacement caused by a resultant force of the internal stress in the membrane and the pressure applied by the difference in atmospheric pressure between the interior and exterior of the cavity (about one atmospheric pressure=101325 Pa). As the internal stress to be applied, a thermal contraction stress generated by the temperature difference caused between the times before and after formation of the membrane was assumed. A model of an element in which eleven cells were arranged along each side was prepared, and the amounts of initial displacement of the membrane caused in the cells when the internal stress due to thermal contraction was applied to the membrane and the insulating layer were calculated. Analysis using the finite element method was performed by commercially available software (ANSYS 11.0 from ANSYS, Inc.).

Figure 7:
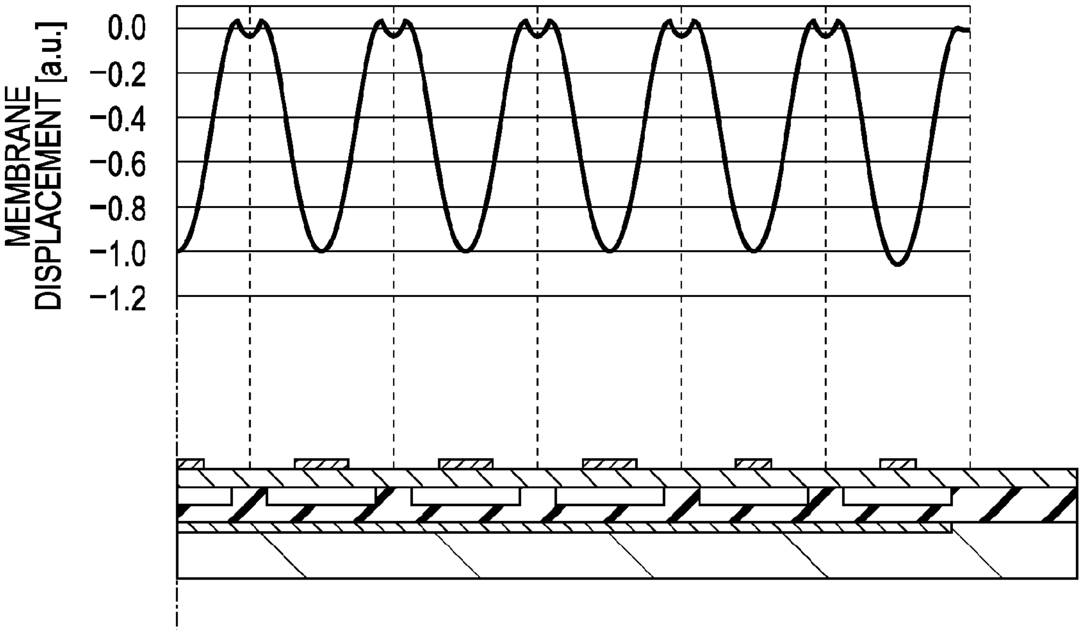
FIG. 7 is a schematic view illustrating an initial displacement amount provided when no groove is formed.

FIG. 7 shows the initial displacement amounts of the membrane in the cells that are calculated when a groove is not provided in the membrane. This calculation result shows that the initial displacement amount of the cell on the outermost periphery (endmost cell) is larger than those of the other cells when a groove is not provided.

Figure 9A:
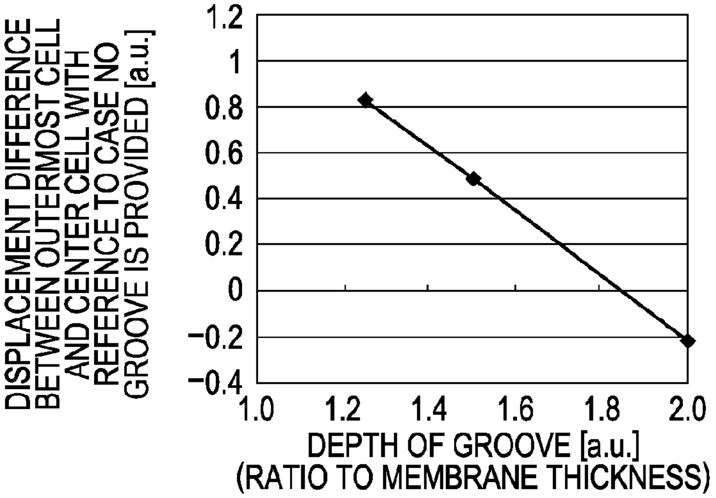
FIGS. 9A to 9C are graphs showing advantages obtained when a groove is formed on the outer periphery of the element.
Figure 9B:
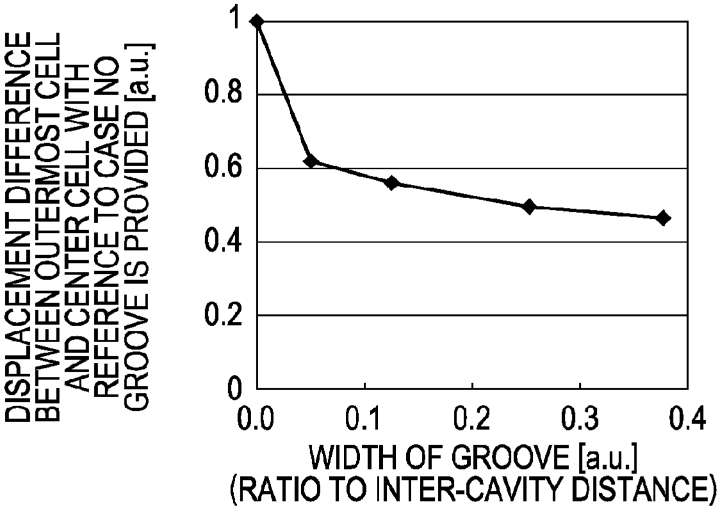

Next, it was examined how the variation in initial displacement amount of the membrane was changed by the difference in shape of a groove formed on the outer side of the cell on the outermost periphery of the element. FIGS. 9A and 9B show the results of comparison of differences in initial displacement amount between the center cell and the cell on the outermost periphery of the element (hereinafter simply referred to as difference in initial displacement amount).

Figure 8:
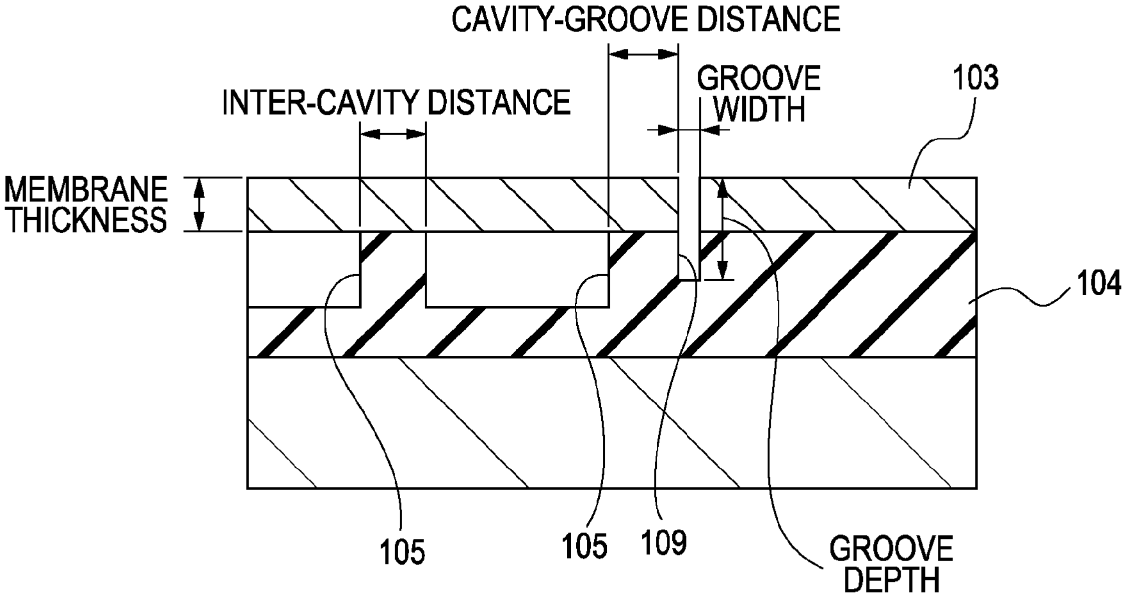
FIG. 8 is a schematic view illustrating a structure in which a groove is formed.

FIG. 9A shows the relationship between the depth of the groove and the difference in initial displacement amount. As shown in FIG. 8, the depth of the groove represents a length of the groove in a direction perpendicular to a surface on which the cells are arranged, and the width of the groove represents a length of the groove in a direction parallel to the surface on which the cells are arranged. In FIG. 9A, the vertical axis indicates the ratios of the difference in initial displacement in different conditions provided in a case in which the difference in initial displacement amount made when the depth of the groove is zero (no groove) is one. The horizontal axis indicates the value obtained by dividing the depth of the groove by the thickness of the membrane. In this case, the width of the groove is fixed (fixed at 0.25 times the inter-cavity distance) in all conditions, and the distance between the groove and the cavity of the cell on the outermost cell is set to be equal to the distance between the cavities (inter-cavity distance). This result shows that the difference in initial displacement amount decreases as the depth of the groove increases. Accordingly, it is preferable that the groove penetrate the membrane into the insulating layer serving as the support portion.

FIG. 9B shows the relationship between the width of the groove and the difference in initial displacement amount. The vertical axis indicates the ratios of the difference in initial displacement in different conditions provided in a case in which the difference in initial displacement amount made when the depth of the groove is zero (no groove) is one. The horizontal axis indicates the value obtained by dividing the width of the groove by the inter-cavity distance. The depth of the groove is fixed (fixed at 1.5 times the thickness of the membrane) in all conditions, and the distance between the groove and the cavity of the cell on the outermost periphery is set to be equal to the inter-cavity distance. This result shows that the difference in initial displacement amount decreases as the width of the groove increases. Further, the difference in initial displacement amount can be reduced by about 40% by setting the width of the groove to be 10% of the inter-cavity distance.

Figure 9C:
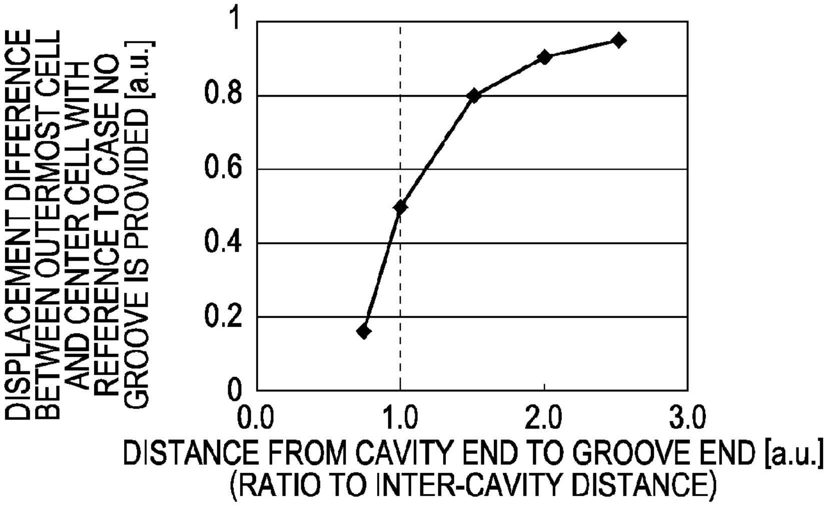

In addition, the difference in initial displacement corresponding to the distance between the groove and the cell on the outermost periphery ("cavity-groove distance" in FIG. 8) was compared. FIG. 9C shows the result of comparison. The vertical axis indicates the ratios of the difference in initial displacement provided in a case in which the difference in initial displacement amount made when there is no groove is one. The horizontal axis indicates the value obtained by dividing the distance between the groove and the outermost cell by the inter-cavity distance (gap). In all conditions, the depth of the groove is fixed (fixed at 1.5 times the thickness of the membrane), and the width of the groove is also fixed (fixed at 0.25 times the inter-cavity distance). This result shows that the effect of reducing the difference in initial displacement amount increases as the distance between the groove and the outermost cell decreases. However, in order to prevent the strength of the support portion supporting the membrane of the outermost cell from decreasing, the distance between the groove and the outermost cell is preferably more than or equal to 50% of the inter-cavity distance. Further, in order to reduce the difference in initial displacement amount, the distance between the groove and the outermost cell is preferably less than or equal to 200% of the inter-cavity distance, more preferably, less than or equal to the inter-cavity distance.

Figure 10A:
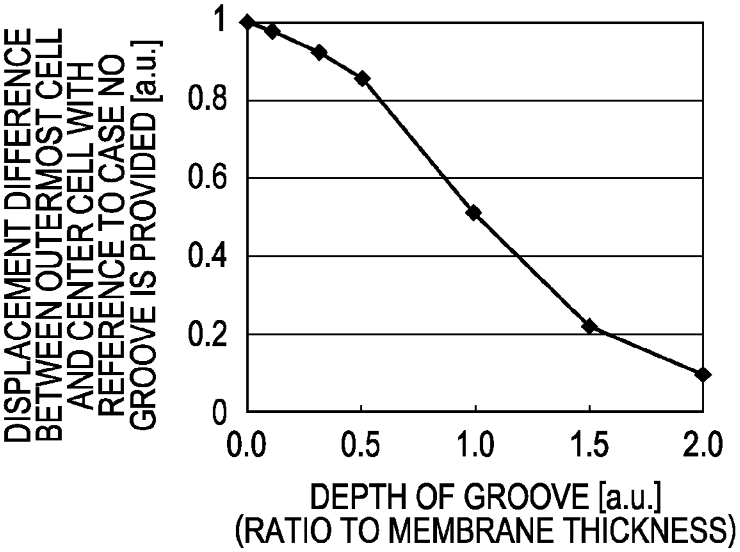
FIGS. 10A and 10B are graphs showing advantages obtained when grooves are formed around the cells.
Figure 10B:
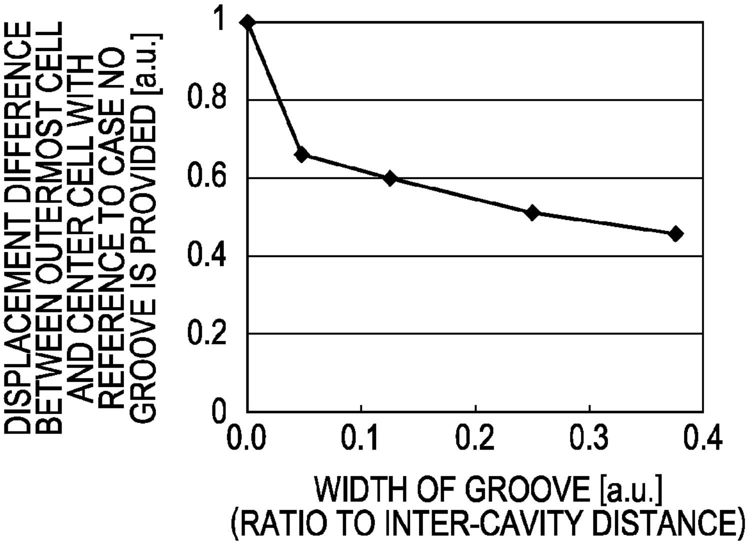
Figure 11A:
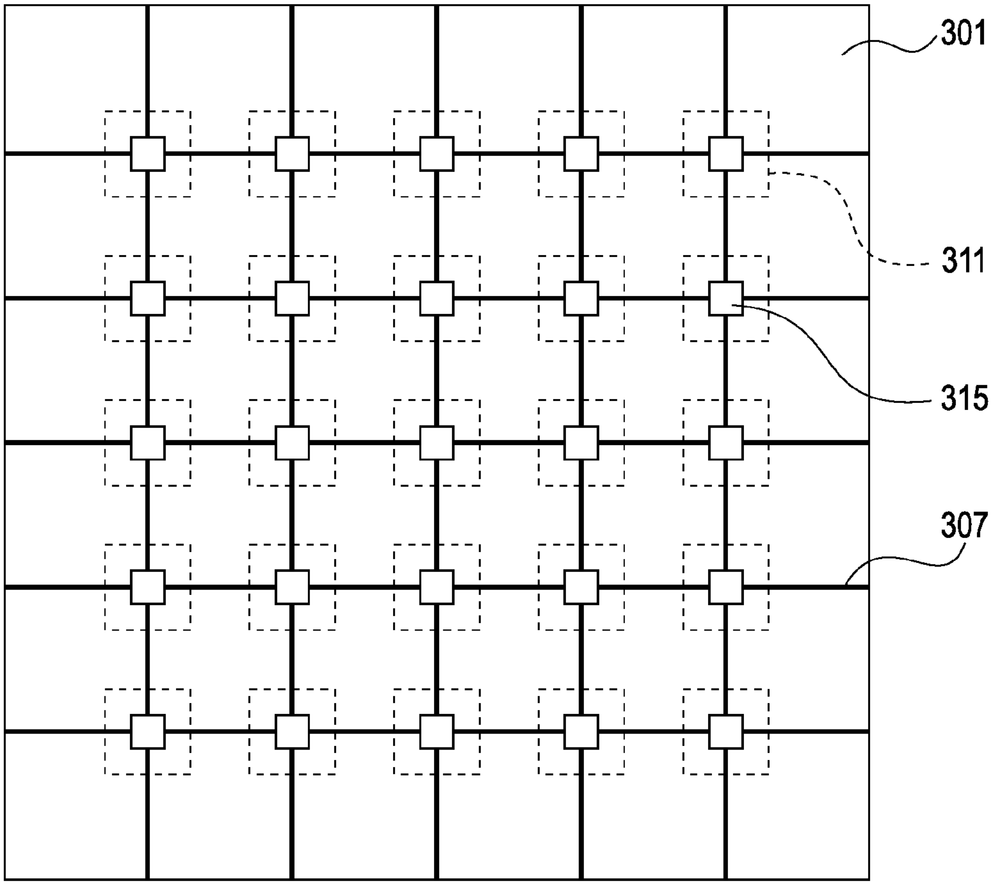
FIGS. 11A and 11B are schematic views showing a structure of an element in a CMUT of the related art.
Figure 11B:
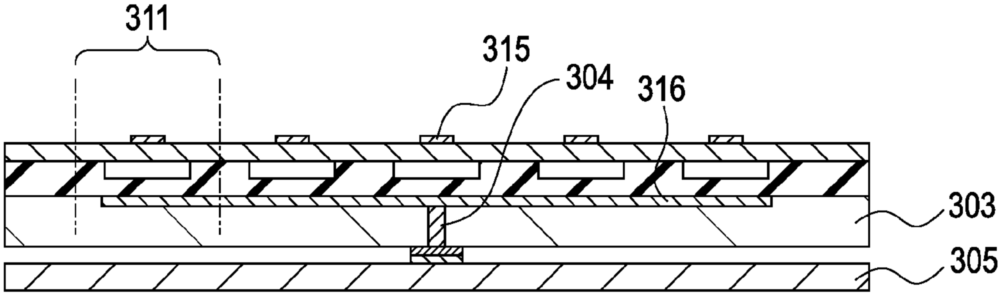

In the present invention, as shown in FIG. 1, grooves may be provided in portions of the membrane between the cavities. That is, the groove may be formed not only on the outer periphery of the element, but also on the outer periphery of each cell. FIGS. 10A and 10B show the results of comparison of differences in initial displacement amount according to differences in groove shape caused when a groove is provided on the outer periphery of each cell. FIG. 10A shows the comparison result obtained in a case in which the difference in initial displacement amount made when the depth of the groove is zero (no groove) is one. The horizontal axis indicates the value obtained by dividing the depth of the groove by the thickness of the membrane. In this case, in all conditions, the width of the groove is fixed at 0.25 times the inter-cavity distance, and the distance between the groove and the cell on the outermost periphery is set to be equal to the inter-cavity distance. This result shows that the difference in initial displacement amount decreases as the depth of the groove increases. Further, the difference in initial displacement amount can be reduced even when the groove does not penetrate the membrane.

FIG. 10B shows the comparison result obtained in a case in which the difference in initial displacement amount made when the width of the groove is zero (no groove) is one. The horizontal axis indicates the value obtained by dividing the width of the groove by the inter-cavity distance (gap). In all conditions, the depth of the groove is fixed at 1.5 times the thickness of the membrane, and the distance between the groove and the cell on the outermost periphery is set to be equal to the inter-cavity distance. This result shows that the difference in initial displacement amount decreases as the width of the groove increases. By setting the width of the groove to be 10% of the inter-cavity distance, the difference in initial displacement amount can be reduced by about 40%.

Second Embodiment

Figure 2A:
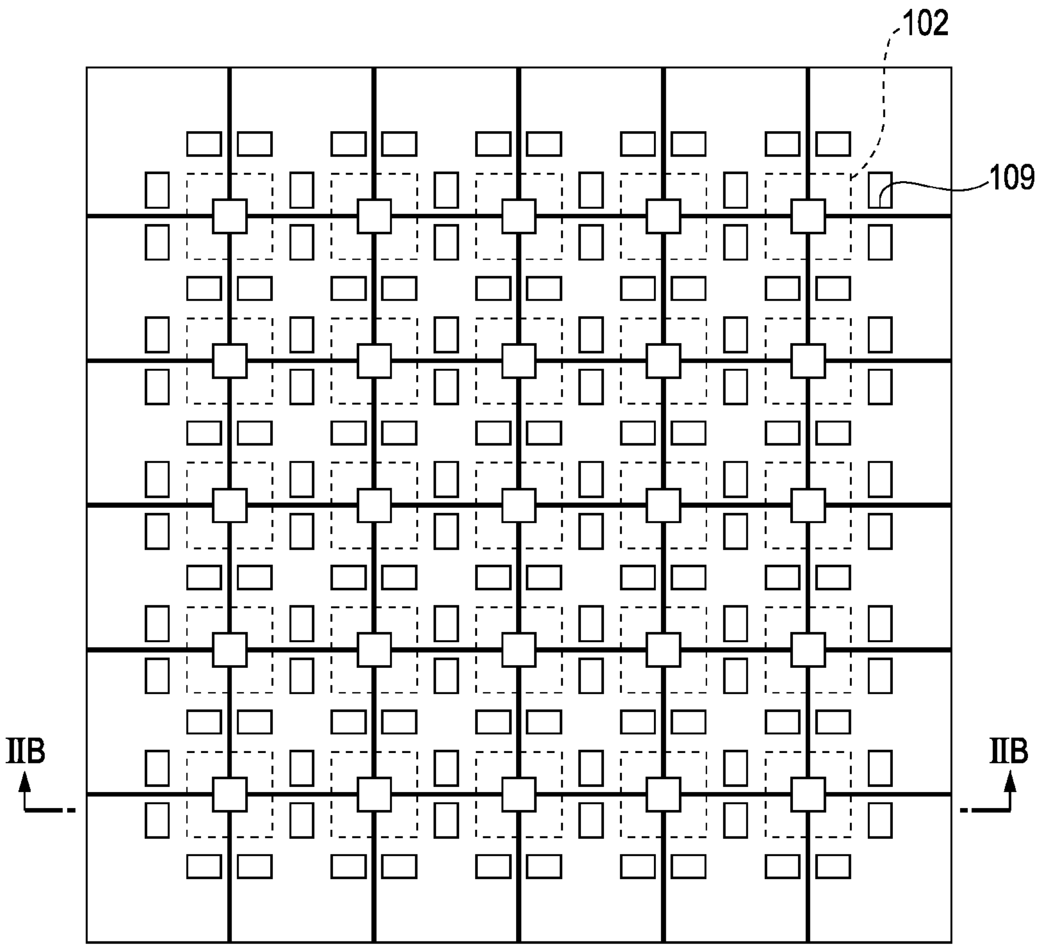
FIGS. 2A and 2B are schematic views illustrating a structure of an element in a CMUT according to a second embodiment of the present invention.
Figure 2B:
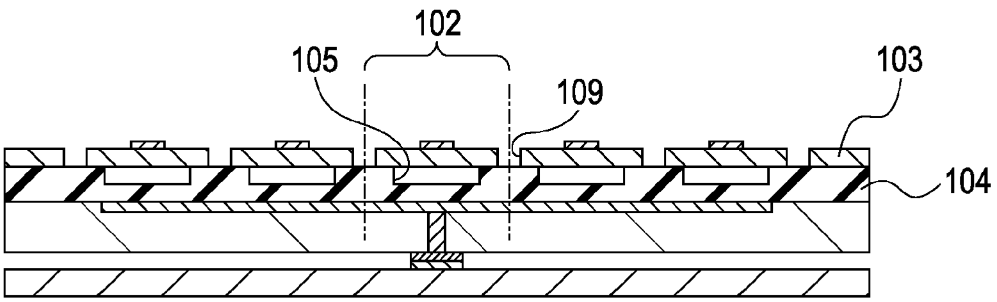

Referring to FIGS. 2A and 2B, in a second embodiment, grooves 109 are intermittently provided in portions of lines surrounding cavities 105 on peripheral edge portions of cells 102. FIG. 2A is a top view of an element of the second embodiment, and FIG. 2B is a cross-sectional view taken along broken line IIB-IIB of FIG. 2A. The grooves 109 penetrate a membrane 103, but are not provided in an insulating layer 104 serving as a support portion. In the second embodiment, since the insulating layer 104 can be used as an etching stop layer during formation of the grooves 109, the grooves 109 can be formed relatively easily.

Third Embodiment

Figure 3:
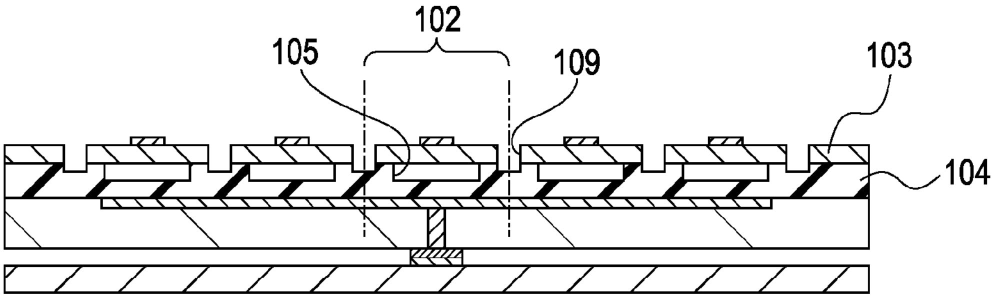
FIG. 3 is a schematic view illustrating a structure of an element in a CMUT according to a third embodiment of the present invention.

In a third embodiment, grooves 109 are intermittently provided in portions of lines surrounding cavities 105 on peripheral edge portions of cells 102, as in the second embodiment shown in FIG. 2A. Further, as shown in FIG. 3, the grooves 109 penetrate a membrane 103 and reach an insulating layer 104 under the membrane 103. In the third embodiment, since the grooves 109 can have a depth larger than the thickness of the membrane 103, a great effect of reducing the differences in displacement amount of the membrane among the cells can be achieved.

Fourth Embodiment

Figure 4:
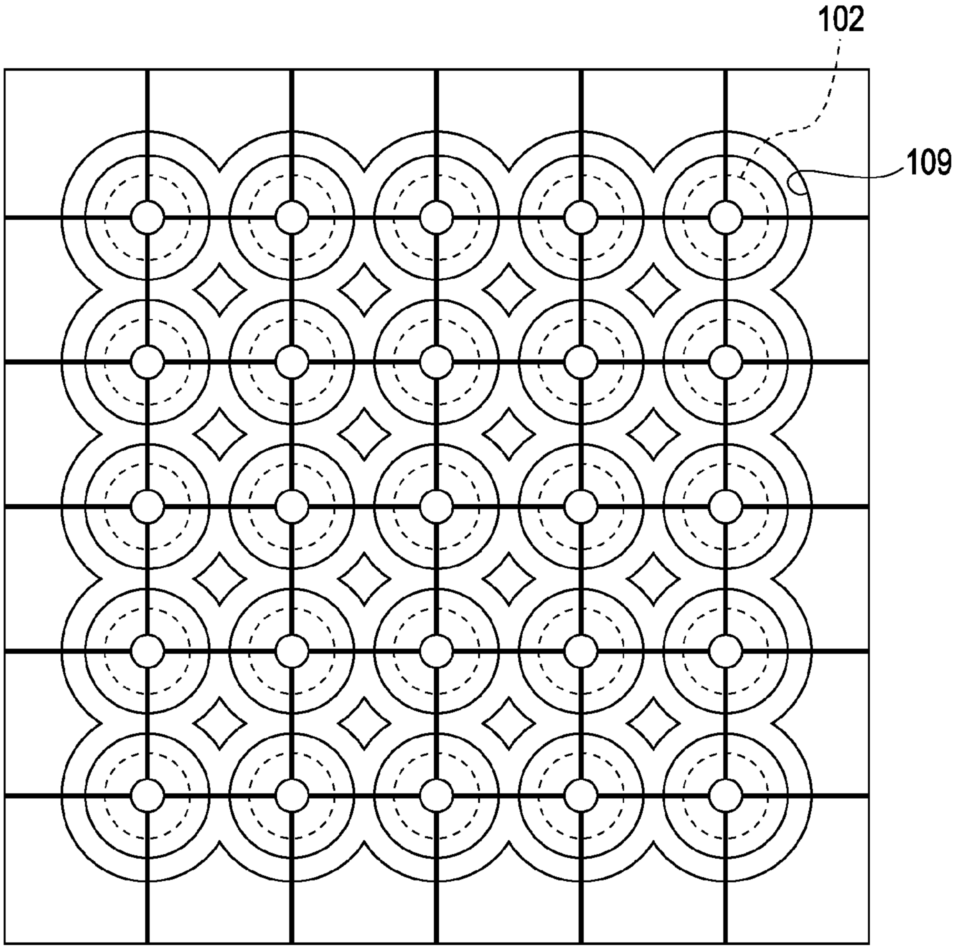
FIG. 4 is a schematic view illustrating a structure of an element in a CMUT according to a fourth embodiment of the present invention.
Figure 5A:
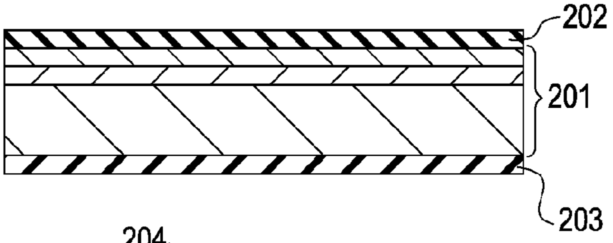
FIGS. 5A to 5G are schematic views illustrating a method for producing a CMUT to which the present invention can be applied.
Figure 5B:
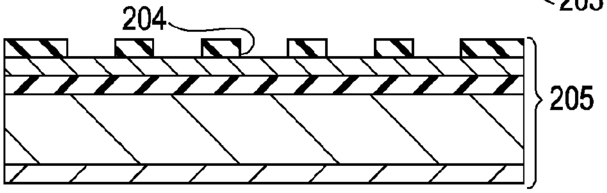
Figure 5C:
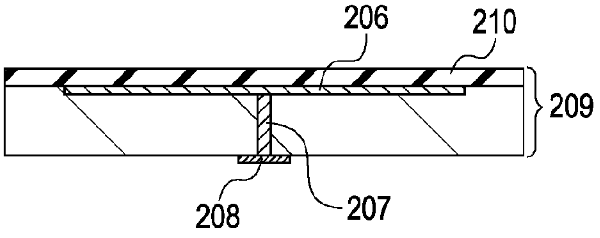
Figure 5D:
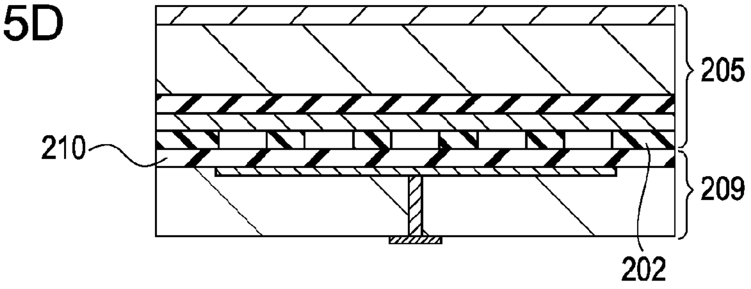
Figure 5E:
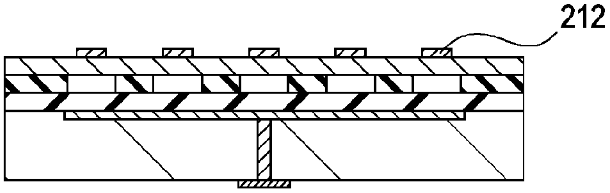
Figure 5F:
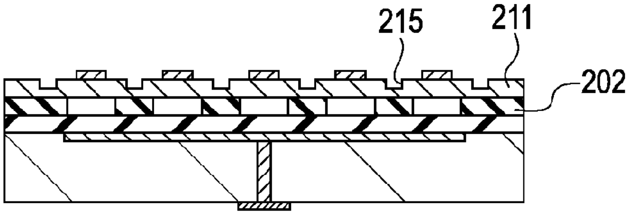
Figure 5G:
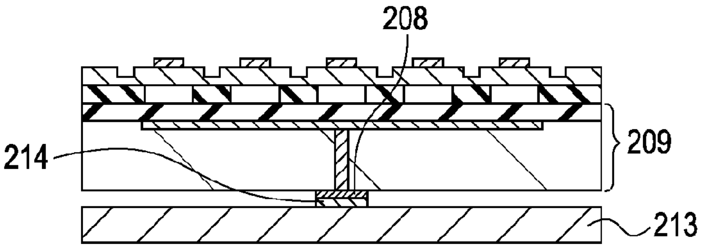

In a fourth embodiment, the present invention is applied to a CMUT in which cells 102 have a shape different from the square shape. When the cells 102 are circular, as shown in FIG. 4, grooves 109 each shaped like an arc having a radius larger than that of the cell 102 and being concentric with the cell 102 are provided in peripheral edge portions of the cells 102.

Production Method

With reference to FIGS. 5A to 5G, a description will be given of a production method for a CMUT including grooves provided in peripheral edge portions of cells, as in the above-described first embodiment. This production method is based on the CMUT production method disclosed in U.S. Pat. No. 6,958,255. The production method for the electromechanical transducer of the present invention is not limited to this production method. For example, a sacrifice layer may be formed on a substrate, a membrane may be formed on the sacrifice layer, and the sacrifice layer may be etched to form cavities (surface micromachining). FIGS. 5A to 5G correspond to the following steps (a) to (g), respectively.

(a) Silicon oxide layers 202 and 203 are respectively formed on opposite surfaces of a SOI (Silicon On Insulator) substrate 201.

(b) Through holes 204 are formed in portions of the silicon oxide layer 202 where cavities of cells are to be formed, thereby forming a device substrate 205.

(c) A silicon oxide layer 210 is formed on an upper surface of a through line substrate 209 including a lower electrode 206, a through line 207, and a pad 208.

(d) The portion of the silicon oxide layer 202 remaining on the device substrate 205 is joined to the silicon oxide layer 210 on the upper surface of the through line substrate 209.

(e) The layers other than the silicon oxide layer 202 of the device substrate 205 and a membrane 211 of the SOI substrate 201 are removed so that the silicon oxide layer 202 and the device layer 211 remain on the through line substrate 209, and upper electrodes 212 are formed on an upper surface of the membrane 211.

(f) Portions of the membrane 211 on the outer peripheries of the cells are at least partly etched to form grooves 215. In this case, the depth of the grooves 215 is smaller than the thickness of the membrane 211. To form grooves 215 having a desired depth, for example, the etching time can be adjusted in accordance with the etching rate of the membrane 211 checked beforehand.

(g) The pad 208 on a lower surface of the through line substrate 209 is joined to a pad 214 on an upper surface of a circuit board 213.

In the above-described step (f), the grooves 215 can be formed so as to have a depth equal to the thickness of the membrane 211, as shown in FIG. 6B1. When the membrane 211 is formed of single-crystal silicon and the silicon oxide layer 202 is formed of silicon oxide, an etching material, such as carbon tetrafluoride, which is insensitive to silicon oxide and sensitive to single-crystal silicon is used. This allows grooves penetrating the membrane 211 to be formed easily. By further etching the silicon oxide layer 202 subsequently to the step shown in FIG. 6B1, deeper grooves 215 can be formed as shown in FIG. 6B2. When the membrane 211 and the silicon oxide layer 202 are formed by the same materials as above, an etching material, such as silicon hexafluoride, which is insensitive to single-crystal silicon and sensitive to silicon oxide is used. This allows grooves 215 to be formed by etching portions of the silicon oxide layer 202 under the grooves 215 in the membrane 211, with the membrane 211 used as a mask.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An electromechanical transducer comprising an element including a plurality of cells, the cells each including a first electrode, and a second electrode provided with a cavity being disposed between the first electrode and the second electrode, wherein a groove is provided so as to surround an outer side of the cells on outermost periphery of the element, and wherein a width of the groove is 10 percent or more of the distance between the cavities of the cells included in the element.

2. The electromechanical transducer according to claim 1, wherein the groove is formed in a thin film that forms a vibrating film to be deformed by a potential difference between the first electrode and the second electrode.

3. The electromechanical transducer according to claim 2, wherein the groove penetrates the thin film into a support portion configured to support the thin film.

4. The electromechanical transducer according to claim 2, wherein the groove is also provided in a portion of the thin film between the cavities.

5. The electromechanical transducer according to claim 1, wherein the groove continuously extends on an outer side of the cells on the outermost periphery of the element.

6. The electromechanical transducer according to claim 1, wherein the groove is partially interrupted in outer periphery of the cells on the outermost periphery of the element.

7. An electromechanical transducer comprising an element including a plurality of cells, the cells each including a first electrode, a thin film provided with a cavity being disposed between the first electrode and the thin film, and a second electrode formed on the thin film, wherein a portion of the thin film, provided on an outer side of the cells on the outermost periphery of the element, is thinner than a portion of the thin film provided on the cavity, or is removed, wherein the portion is formed so as to surround the outer side of the cells on the outermost periphery of the element, and wherein a width of the portion of the thin film, provided on the outer side of the cells on the outermost periphery of the element, is 10 percent or more of the distance between the cavities of the cells included in the element.

8. The electromechanical transducer according to claim 7, wherein a portion of the thin film, on a portion between the cavities, is also thinner than a portion of the thin film provided on the cavities, or is removed.

9. The electromechanical transducer according to claim 7, wherein the portion continuously extends on the outer side of the cells on the outermost periphery of the element.

10. The electromechanical transducer according to claim 7, wherein the portion is partially interrupted in outer periphery of the cells on the outermost periphery of the element.

11. The electromechanical transducer according to claim 1, wherein a distance between the groove and the cavity of a cell on the outermost periphery of the element is 50 percent or more and 200 percent or less of a distance between the cavities of the cells included in the element.

12. The electromechanical transducer according to claim 7, wherein a distance between the portion of the thin film, provided on the outer side of the cells on the outermost periphery of the element, and the cavity of a cell on the outermost periphery of the element is 50 percent or more and 200 percent or less of a distance between the cavities of the cells included in the element.

13. The electromechanical transducer according to claim 1, wherein the distance between the groove and the cavity of the cell on the outermost periphery is set to be equal to a distance between the cavities.

14. The electromechanical transducer according to claim 7, wherein the distance between the portion of the thin film, provided on the outer side of the cells on the outermost periphery of the element, and the cavity of the cell on the outermost periphery is set to be equal to a distance between the cavities.

* * * * *